United States Patent [19]

Sabado

[11] Patent Number: 5,054,188
[45] Date of Patent: Oct. 8, 1991

[54] TRIM CUT AND FORM MACHINE

[75] Inventor: Gregorio T. Sabado, Boise, Id.

[73] Assignee: Micron Technology, Inc., Boise, Id.

[21] Appl. No.: 482,047

[22] Filed: Feb. 20, 1990

[51] Int. Cl.⁵ .............................................. B26F 1/00
[52] U.S. Cl. ..................................... 29/564.6; 72/339
[58] Field of Search ........................ 29/564, 564.6, 741;
140/105; 83/698; 72/336, 337, 339

[56] References Cited

U.S. PATENT DOCUMENTS

| | | | |
|---|---|---|---|
| 3,296,905 | 1/1967 | Killaly | 83/635 |
| 3,348,443 | 10/1967 | Smith et al. | 83/635 |
| 3,759,130 | 9/1973 | Patterson | 83/698 |
| 4,079,489 | 3/1978 | Kowalski et al. | 29/566.2 |

OTHER PUBLICATIONS

Research Disclosure, #18619 Punch Locking Cam, by H. A. Olufsen et al., Oct. 1979.

Primary Examiner—Daniel W. Howell
Attorney, Agent, or Firm—Stephen A. Gratton; Robert A. de Groot

[57] ABSTRACT

A trim, form and cut machine for trimming plastic flash from an IC chip and cutting the connections between chip leads. The machine utilizes interchangeable modules and interchangeable punches and is designed with a self-cleaning feature. Air jets and passageways are provided to remove the material trimmed from the IC chips and leads.

17 Claims, 8 Drawing Sheets

TRIM CUT AND FORM MACHINE

BACKGROUND OF THE INVENTION

This invention relates to an improved trim, cut and form machine containing trimming, cutting and forming modules that produce integrated circuit (IC) packages. The modules contain replaceable trimming, cutting and forming tools and have unique air passages to provide a self-cleaning feature during operation. The modules are inserted into a trimming and forming hydraulic press.

The final steps in the manufacture of an IC chip package such as dual in-line packages (DIP), zig-zag in-line packages (ZIP), plastic leaded chip carriers (PLCC) and small outline J-leaded (SOJ) packages consist of trimming off the excess plastic mold "flash" material that is left behind after plastic encapsulation, trimming off dambar (i.e. metal between leads), cutting the leads to proper length, and forming the leads to a particular configuration. These operations immediately precede the removal of the IC package from its carrier, the lead frame.

Because of the difference in configurations, dimensions and number of leads between IC packages, a large assortment of tools are needed. These trimming, cutting and forming tools are inserted into a trimming and forming hydraulic press.

U.S. Pat. No. 4,079,489 discloses a computer controlled placement machine that punches an IC chip from a film strip, forms the leads and then places the chip on a multi-layer substrate containing a plurality of similar chips.

Prior art trimming and cutting tools have typically been in the shape of a comb. The number of cutting or trimming teeth in the comb would match the number of IC package leads that required cutting or trimming. This number can range typically from 8-30 leads. The consequence of worn or damaged "teeth" in the tool would be that the whole tool would be scrapped. A particular tool can typically process (trim or cut) 50,000-80,000 IC packages prior to replacement for wear.

Additionally, currently available trim and cut machines tend to collect metal and plastic debris such that they remain trapped in the machine. In order to extend the life of the non-lubricated moving machine parts, it is necessary to periodically shut down the machine and perform a cleaning operation to remove metal and plastics particulate.

SUMMARY OF THE INVENTION

It is the object of the present invention to provide modules for installation in the hydraulic press wherein the modules contain individual, cutting and trimming punches, individual forming dies, and guide blocks having air passages. The use of individual punches allows exchange or resharpening of dull punches. The air passages and the compressed air create an air blast, a self-cleaning system that removes plastic and metal chips from the trimming, cutting and lead forming areas of the modules. The punches are machined to specific dimensions for a particular product (i.e. SOJ, DIP, ZIP or PLCC), from carbide steel quills which are essentially a square cross-sectional rod having typical dimensions of 0.1 ×0.1×0.1×2 inches. The use of separate cutting and trimming punches permits replacement or sharpening of individual punches and avoids discarding the entire tool used in prior art. It is also possible to rotate the punches in their guides to utilize another unused cutting edge. The guide blocks that support the punches for removing plastic and tie bars have air passages along their vertical length to allow air to pass down the length of the punch and blow chips out the bottom of the press. The use of the air creates a clean and low-maintenance system.

DETAILED DESCRIPTION OF THE INVENTION

Figure 1:
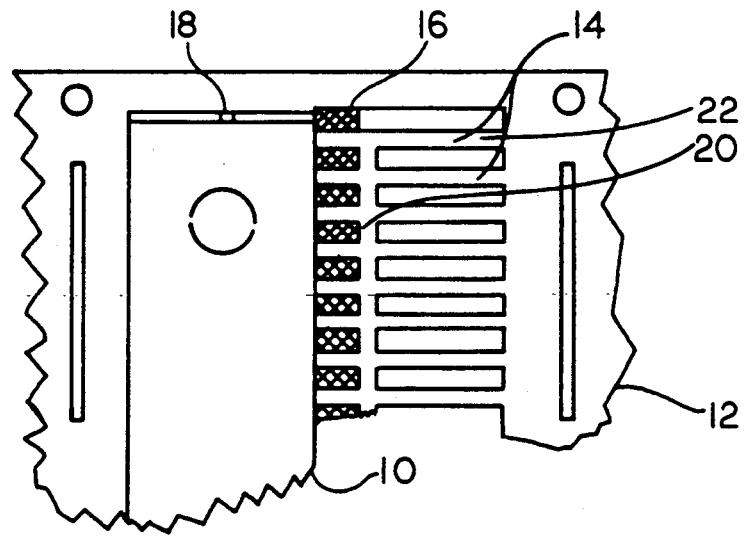
FIG. 1 is a partial plan view of a zig-zag in-line package (ZIP) prior to trimming, cutting and forming.

FIG. 1 illustrates the configuration of encapsulated integrated circuit (IC) chip 10 on lead frame 12. In this case the IC chip 10 in partial plan view is a zig-zag in-line package (ZIP) having sixteen pin leads 14, eight of which are shown. In this view the excess plastic or flash 16 has not yet been removed from what would normally be a void space between leads 14, nor has the dambar 20 been removed to electrically separate the leads 14 from adjacent leads. An additional step that has not been done, is cutting of the leads at 22 so as to separate the leads 14 from lead frame 12. The IC chip 10 is attached to lead frame 12 by a metal tie bar 18.

Figure 2:
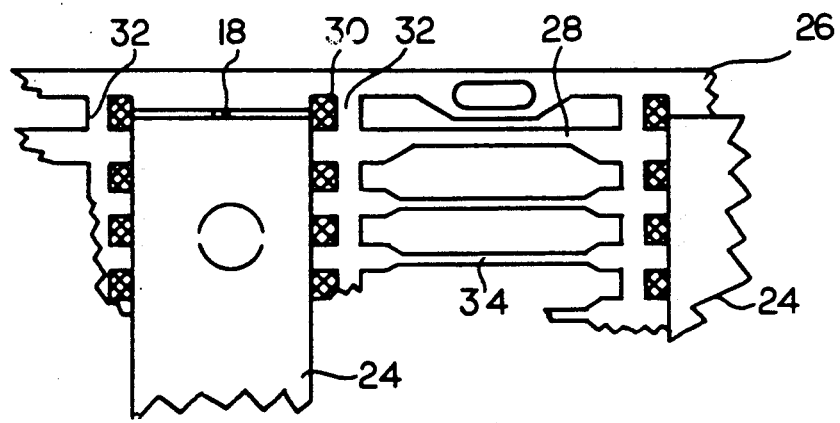
FIG. 2 is a partial plan view of a dual in-line package (DIP) prior to trimming, cutting and forming.

An encapsulated dual in-line package (DIP) IC chip 24 is illustrated in FIG. 2 in lead frame 26 wherein three of the eight leads 28 (on each side) are shown. In this view the flash 30 fills the void between chips 24 and dambar 32. Again as in FIG. 1, the lead 28 has not been cut at 34 to separate the leads between each chip 24.

Figure 3:
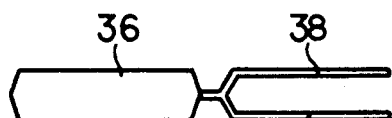
FIG. 3 is a side elevation of a ZIP after trimming, cutting and forming.

FIG. 3 illustrates a side elevation of a ZIP 36 after trimming of the flash and dambars, cutting off the tie bars, cutting the leads and forming each of the sixteen leads. Eight leads have been formed in an up direction at 38 and the other eight (alternate) leads have been formed in a down direction at 40.

Figure 4:
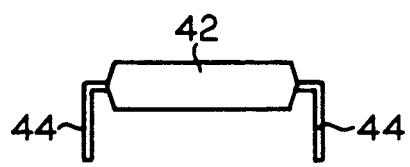
FIG. 4 is a side elevation of a DIP after trimming, cutting and forming.

FIG. 4 illustrates a side elevation of a dual in-line package (DIP) 42 after processing and lead forming as above except all the leads 44 are formed downward at right angles to the DIP.

Figure 5:
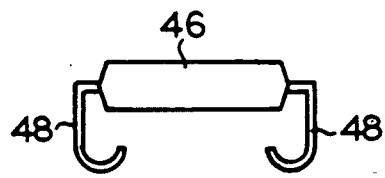
FIG. 5 is a side elevation of a small outline J-leaded (SOJ) package after trimming, cutting and forming.

A side elevation of FIG. 5 a small outline J-leaded (SOJ) package 46 is illustrated in FIG. 5, after processing as above except as noted the leads 48 are formed downward to a "J" configuration.

Figure 6:
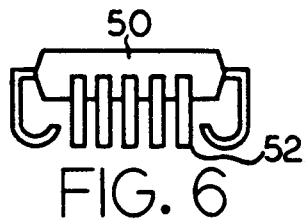
FIG. 6 is a side elevation of a plastic leaded chip carrier (PLCC) after trimming, cutting and forming.

FIG. 6 illustrates a side elevation of a processed plastic lead chip carrier (PLCC) 50 which has leads 52 on all four sides formed to a J-shape somewhat like the SOJ package.

As illustrated in FIGS. 1-6, a relatively small number of the different lead configurations and number of leads on IC chips available in the industry are illustrated. For example, there are at least seven DIP product configurations, two ZIP configurations, three SOJ configurations and five PLCC configurations. Therefore, it is highly desireable for the trim and form machine to be provided with the capability of easily replacing tooling so as to reduce costly machine downtime. It is the intent of this invention to provide easily exchangeable modules that also provide individual trim and form punches and dies.

Figure 7:
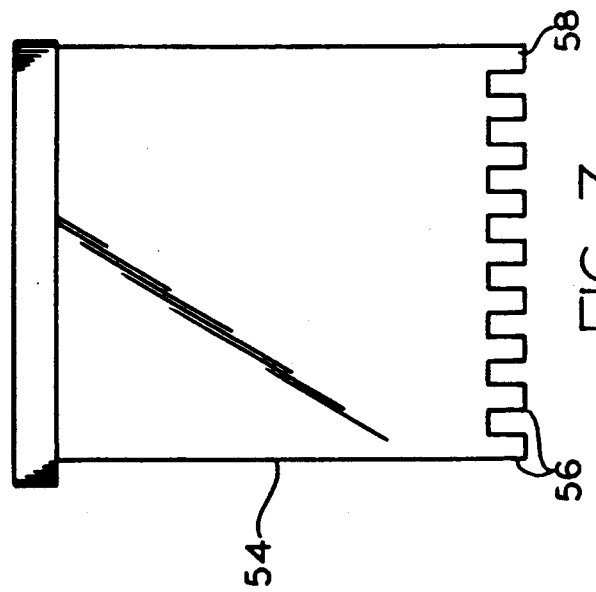
FIG. 7 is a side elevation of a prior art trim tool punch.

FIG. 7 illustrates the enlarged view of prior art punch 54 which is one piece and has nine teeth 56 to punch out (or trim) the flash material (in this case sixteen lead DIP which has eight leads on each side). The same configuration would be used to punch out the dambars 32 between leads 28 (FIG. 2) except that the punch tip 58 cross-section might be slightly different due to cross-sectional area differences between the flash and dambar.

Figure 8:
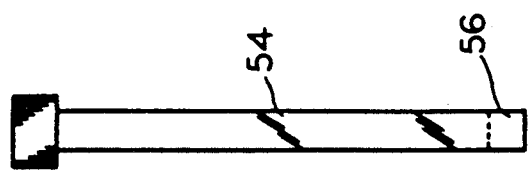
FIG. 8 is an end elevation of a prior art trim tool punch.

An end view of the prior art punch 54 is illustrated in FIG. 8. It should be noted at this point that one broken tooth requires discarding the entire tool.

Figure 9:
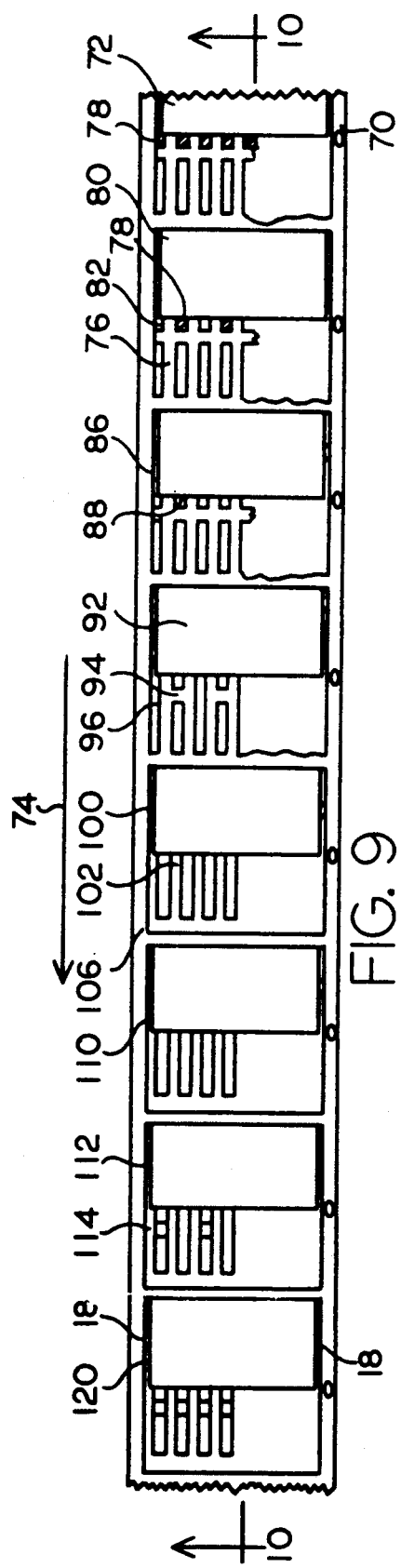
FIG. 9 is a plan view of a lead frame containing ZIPs in progressive stages of flash trimming, tie bar trimming, lead cutting and Z-lead forming.
Figure 10:
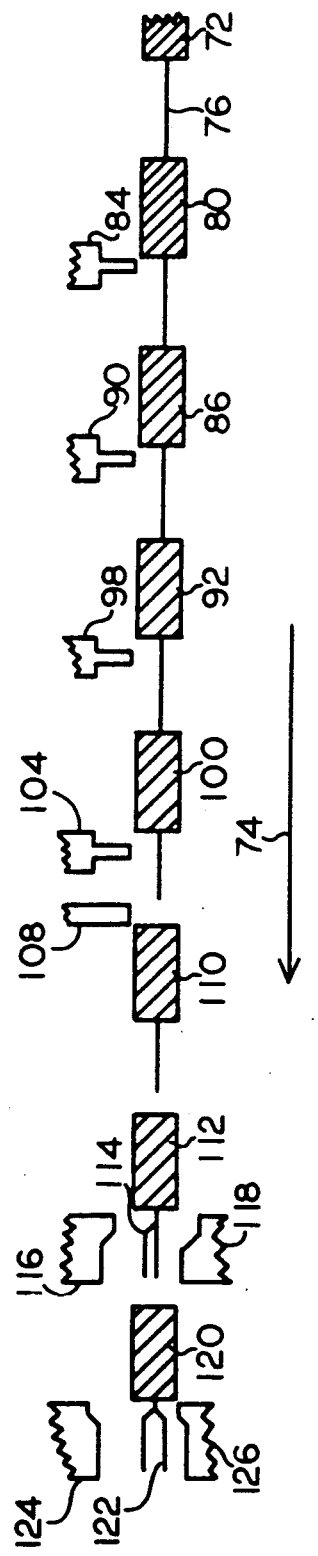
FIG. 10 is a side section view through FIG. 9 illustrating the progressive stages of ZIP lead trimming and forming.

In order to understand the assembly and operation of the present invention, the progressive stages of flash trimming, dambar punching, lead cutting and forming on the IC chip and lead frame will be explained by referring to FIGS. 9 and 10. Lead frame 70 supporting IC chip 72 is ratcheted through the hydraulic form tool machine in the direction shown at arrow 74. It stops under each tool (as shown in FIG. 10) which performs a different operation or operates on a different set of leads 76. On the left side of IC chip 72 the plastic flash 78 (darkened) can be seen between all leads 76 and chip 72. In this particular IC chip example there would be nine flash 78 sections surrounding eight leads 76. Moving in the direction of arrow 74 it can be seen that the IC chip at position 80 has had half of the flash removed at 82. Every other flash is trimmed by first trim punch 84 at this position 80. At the next IC chip position 86, the remaining half of the flash 78 is trimmed as shown at 88 by a second trim punch 90. At the next position 92 half of the dambars 94 have been removed as shown at 96 by a first dambar punch 98. Continuing to the next position 100, the remaining half of the dambars have been punched as shown at 102, by a second dambar punch 104. Also in this position 100 all the leads 76 are cut at 106 by cutting punch 108. At the next position 11 there is no action except for vacuuming of parts to insure cleanliness. At the next position 112 half of the leads 76 are formed up (zigged) at 114 by a first form punch 116 and first form die 118. At final forming position 120, the remaining half of leads 76 are formed down at 122 by a second form punch 124 and second form die 126. It should be noted that all tools in FIG. 10 are shown in an up-retracted position, i.e. the tools above the lead frame are raised and the dies below the lead frame are not in contact with the leads. This presents a "neutral position" of the machine where the lead frame and IC chips can be ratcheted in the arrow direction 74. In this "neutral" position the upper part of the machine holding the punches is in an up-retracted position by action of a hydraulic press. Not shown in these figures is the separate operation of tie bar 18 cutting and IC chip removal from the lead frame 70.

Figure 11:
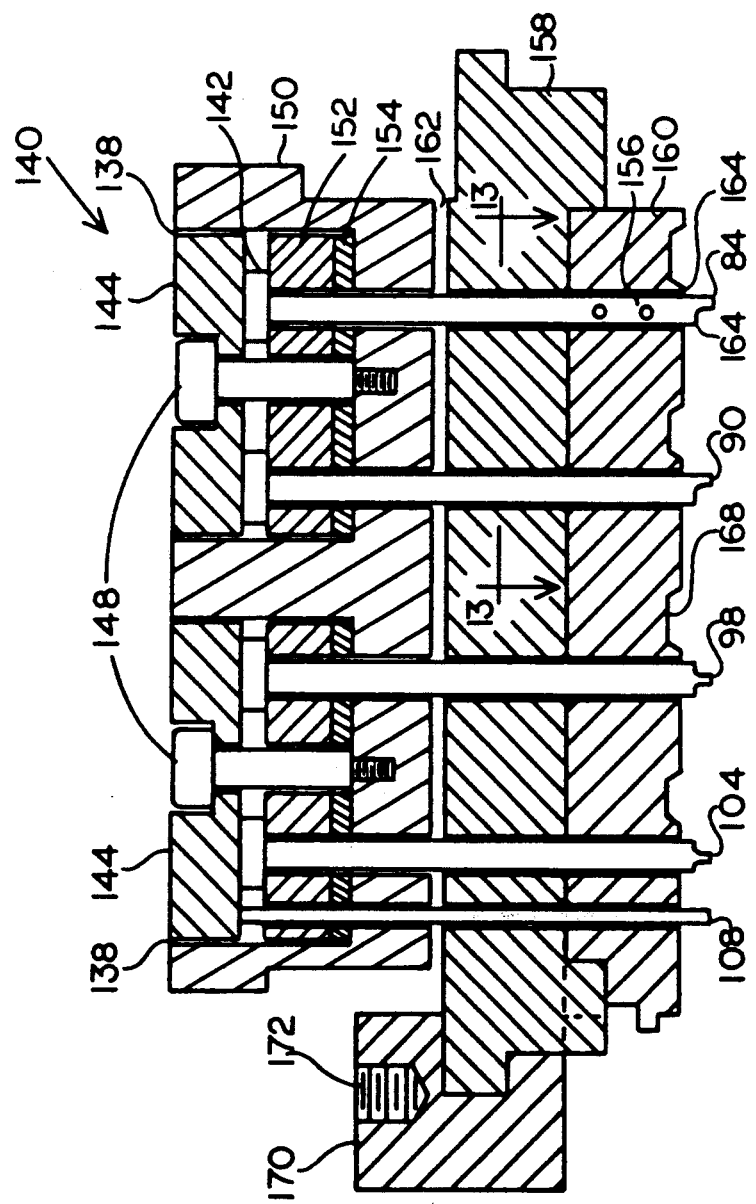
FIG. 11 is a side section view through the trim module of the present invention.

Referring to the FIG. 11 side section view, the tools 84, 90, 98, 104, 108 as described above and shown in FIG. 10 are contained within cavities 138 in trim module 140. The tool heads 142 in this module are held down at their upper end by upper plates 144, which are held in place by shoulder bolts 148. These bolts thread into trim upper guide 150 and securely clamp middle plate 152, and lower plate 154. The punch lower ends 156 are contained within a middle guide 158 and lower guide 160. The gap 162 allows a small relative motion between the trim upper guide 150 (including all tools) and the middle and lower guides 158 and 160.

It can be noted that each tool has a small semi-round air gap 164 on either side of the tool to allow the flow of compressed air which enters the middle guide 158 at an orifice on the backside of middle guide 158. The compressed air exits the tool guide 160 at air gap 164 in a downward direction to dislodge any plastic or metal particles that may be lodged on the tools or the tool mating die surface (not shown in FIG. 11), below each tool. This programmed air blast at 80 psi provides a module self-cleaning feature, and also can dislodge chip particles on the chip or upper chip cavity 168. The module is firmly connected to a pair of module support blocks 170 having a threaded aperture 172 for engaging a bolt (only one block is shown).

Sharpening of worn punches or replacement of damaged punches is easily accomplished by removing shoulder bolts 148 and upper plates 144 and turning the trim module over, allowing all punches to drop out. It is also possible to reuse sharpened tools by replacing upper plates 144 with thicker plates and replacing the lower plates 154 with thinner plates thereby extending the punch tip to the same downward position.

Figure 12:
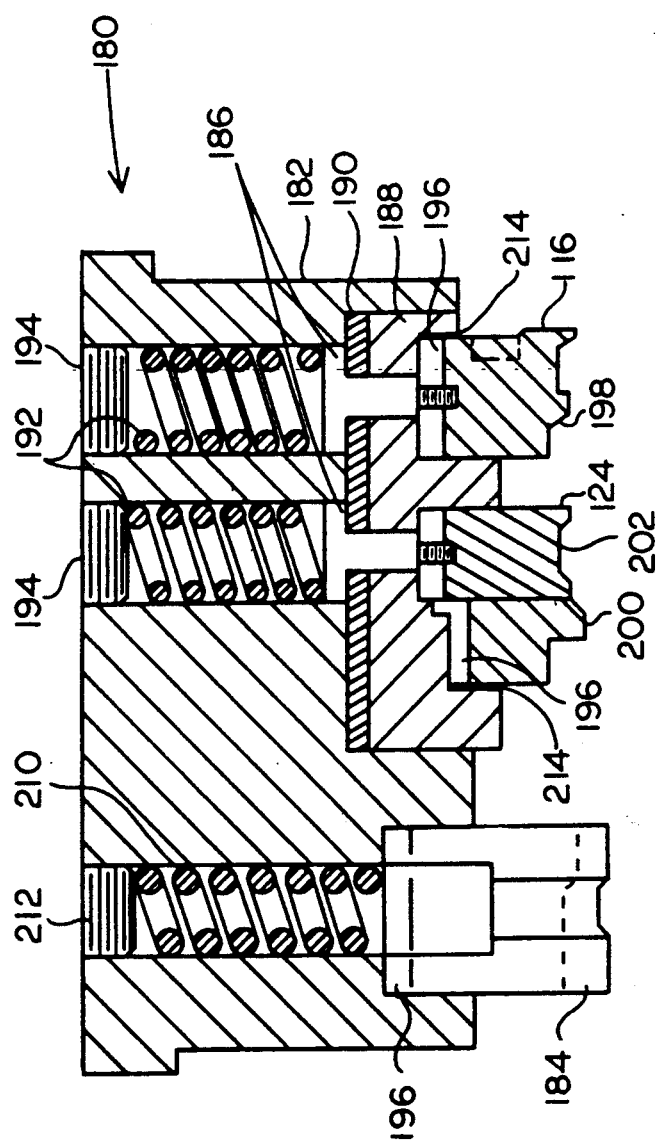
FIG. 12 is a side section view through the form module of the present invention.

FIG. 12 illustrates in section view, the forming module 180 that creates the formed up leads 114 and the formed down leads 122 as described above (illustrated on FIG. 10). The form housing 182 supports three tools, the first form punch 116, the second form punch 124 and a singulation punch 184 that removes the IC chip from the lead frame by cutting the tie bar 18 (FIG. 1). The punches 116 and 124 are threadably fastened to a pair of shoulder fasteners 186 and are laterally restrained within a form block 188. Shim plate 190 is secured between the form block 188 and form housing 182. Shoulder fasteners 186 ar held in a down position by a pair of springs 192. A small upward motion of the form punches 116, 124 is made possible by a gap 196 between the two punches and form block 188. The lead forming surface of each punch is shown at 198 and 200 for punches 116, 124 respectively. A typical form chip cavity is shown at 202.

In a similar manner, the singulation punch has a spring 210, set screw 212, and same gap 196, allowing a small upward motion of the singulation punch 184. The singulation punch removes the chip and leads from the lead frame in preparation for removal from the machine, by cutting the tie bar 18 (FIG. 1).

Exchange or reshaping of the form punches 116 and 124 is easily accomplished by removing the set screws 194 and springs 192 and unthreading the shoulder fasteners 186 from each form punch.

Exchange or reshaping of the singulation punch 184 is accomplished by removing fasteners holding it to the form housing 182.

Air gaps 214 on this module provide for self-cleaning in a similar manner to the trim module. The air supply is connected to the back side of form housing 182.

Figure 13:
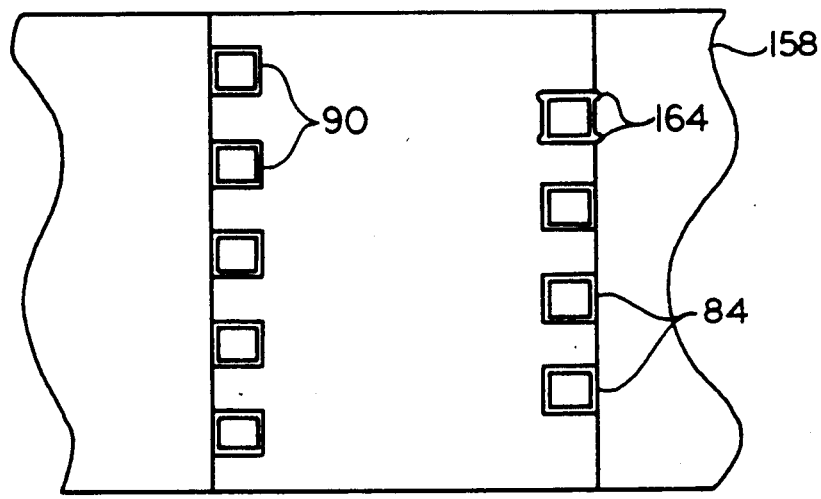
FIG. 13 is a plan view of a section through FIG. 11 of the present invention illustrating punch arrangement in the guide.

FIG. 13 is a section view through FIG. 11, the plan view trim module, illustrating the arrangement of the first trim punches 84 and the row of second trim punches 90 that would be used in alternately trimming flash from a ZIP IC lead frame. The air gaps 164 are shown at the corner of each punch.

Figure 14:
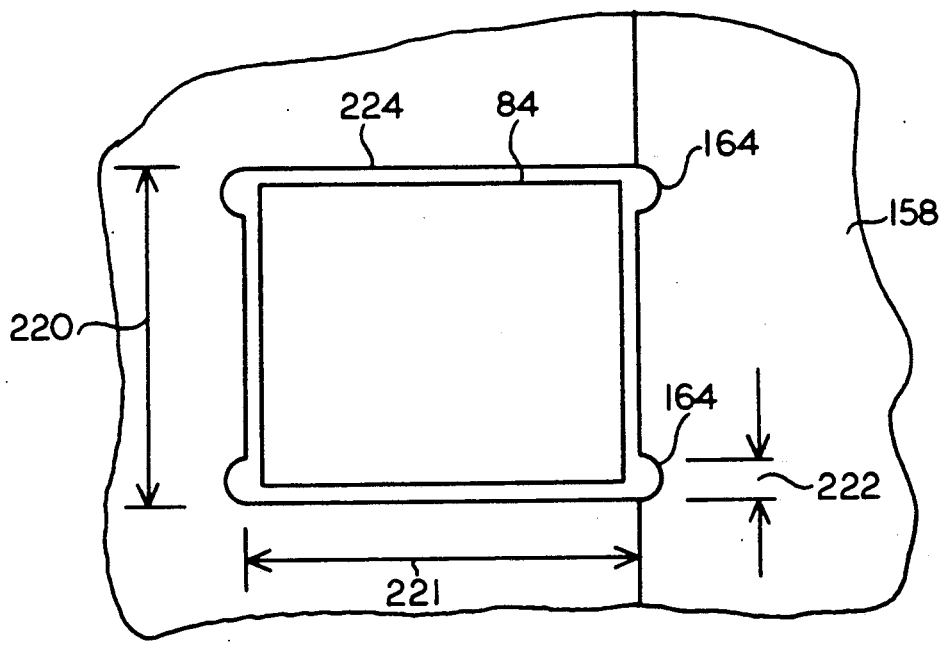
FIG. 14 is an enlarged section detail of the punch and guide.

FIG. 14 is an enlarged view of the same view of the punch 84 and air gaps 164. The dimensions of this particular trim punch are preferably about 0.020×0.060 at 220 and 221 and the air gap dimension at 222 is about 0.006 inches at the corners of square aperture 224.

Figure 15:
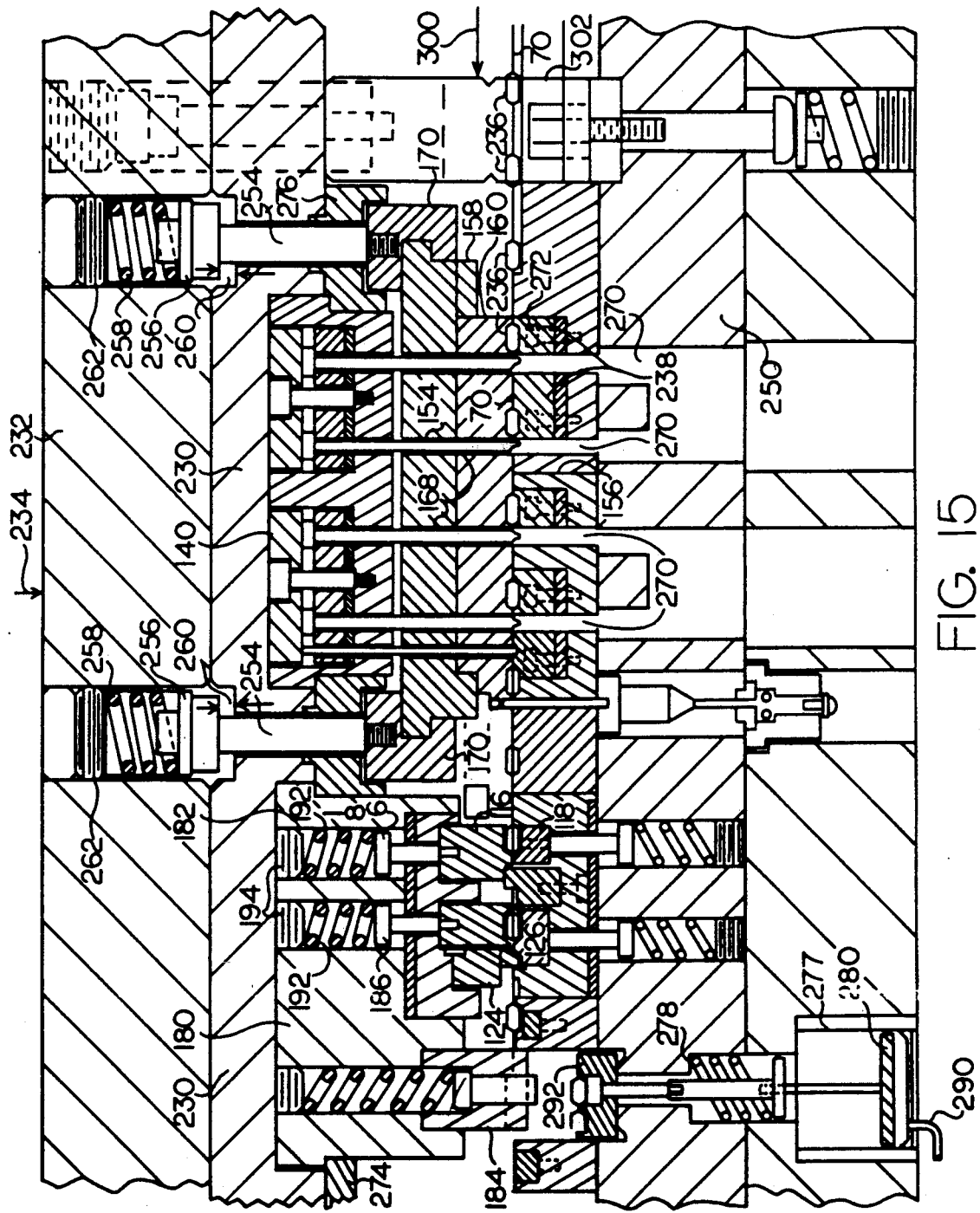
FIG. 15 is a side elevation of the modules assembled into the trim form hydraulic press.

FIG. 15 illustrates the assembled apparatus with the trim module 140 and form module 180 firmly secured within module holder 230. Module holder 230 is directly fastened to an upper block 232 which is shown in a down-actuated position by action of a hydraulic press shown at arrow 234. In this down position the lower guide 160 is in contact with the lead frame 70 and securely holds the IC chips 236 against trim dies 238, which are fastened to the stationary machine base 250.

Lower guide 160 and the attached middle guide 15 are spring-loaded by their connection to the pair of module support blocks 170, threadably fastened to a pair of module bolts 254. The module bolts are held in compression downward by a pair of spring caps 256 and compression springs 258, as evidenced by module bolt gaps at 260. The compression springs are retained and compressed in the upper block by a pair of socket bolts 262. The air gaps 164 around each of the five punches, supply 80 psi air which flows over the leads on each IC chip 236 and carries punched particles of lead and plastic flash into the void spaces 270 between trim dies 238 into the machine base 250.

Removal of the lower dies 238 from machine base 250 for reshaping, sharpening, or replacement is accomplished after removal of the trim module 140. Dies are easily removed by unthreading five cap screws 272, one for each die 238.

The form module 180 and trim module 140 are fastened to module holder 230 and upper block 232 by the form module clamp 274 and a pair of trim module clamps 276. The modules are easily removed by loosening the three clamp fasteners (not shown).

In FIG. 15 the form module 180 and the trim module 140 are in the down-actuated position, since both are actuated together by, for instance, an hydraulic press (not shown). The first and second form punches 116 and 124 are spring-loaded by their connection through shoulder fasteners 186 to springs 192 which are retained by form set screws 194. An exactly similar spring-loading means is provided for the bottom first and second form dies 118, 126.

In a similar manner, the singulation punch 184 is also spring-loaded from above (as illustrated in FIG. 12). After singulation of an IC chip, the lower half moves to a down position (as illustrated), by an air operating means consisting of an air operating cylinder 277 and a carrier spring 278 which is in opposition to air cylinder piston 280. The air cylinder piston 280 is actuated up by controlled air supply 290 at the approximate same time that the hydraulic press motion occurs in a down direction at 234, thereby stamping the IC chip tie bar and freeing the chip from its frame 70 in preparation for lowering as shown on chip carrier 292.

On completion of a stamping cycle, the upper block retracts, lifting all the punches away from the IC chips and lead frame 70 so that the lead frame can be moved o ratcheted one position to the left as shown by arrow 300. In order for the IC chips 236 to clear the dies in the machine base 250, a pair of spring-loaded lead frame lift dies 302 (only one is shown in FIG. 15), raise the IC chips 236 and lead frame 70 prior to ratcheting to left. The other lead frame lift die is at the left end of the machine adjacent to the singulation punch 184.

Spring loading is used throughout the machine to absorb shock as the upper block 232, trim, cut and form tool 140, and form tool 180, slam down on stationary base 250, thereby avoiding breakage of IC chips.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

I claim:

1. A hydraulically operated, self-cleaning trim rm machine for the production of integrated circuit (IC) chips comprising:
   a. an upper block and module holder securely affixed to a hydraulic operating means;
   b. a trim module removably affixed to the module holder and containing a plurality of punches;
   c. a form module removably affixed to the module holder and containing a plurality of punches;
   d. a singulation punch removably affixed to the module holder;
   e. a machine base supporting the hydraulic operating means and holding a plurality of removable dies to engage the trim and form modules and punches when said upper block is in a down-actuated position; and
   f. a chip carrier having air operating means removably affixed to said machine base.

2. The machine as recited in claim 1, wherein the trim module comprises:
   a. a trim upper guide provided with at least one aperture;
   b. a pair of lower plates secured to the upper guide;
   c. a pair of middle plates secured to the lower plates;
   d. a pair of upper plates;
   e. a plurality of punch tool heads affixed between the middle plates and the upper plates;
   f. at least one fastener securely affixing the upper plates, punch, tool heads, middle plates and lower plates to the trim upper guide;
   g. said trim upper guide, lower plates and middle plates are provided with upper guide apertures retaining said punches; and
   h. a middle guide and lower guide engaging a pair of compression springs affixed to the upper block, and a plurality of middle and lower guide apertures slidably engaging a lower end of said punches.

3. The machine as recited in claim 1, wherein the form module comprises:

a. a form housing;
b. a first and second form punch; and
c. a pair of shoulder fasteners threaded into the pair of form punches, wherein the shoulder fasteners are held captive within the form housing and compressed downward by a pair of springs.

4. The machine as recited in claim 2, wherein the trim module apertures slidably engaging a lower end of said punches are provided with a rectangular cross-sectional dimension and are provided with a semi-round air gap aligned in a vertical direction at four corners of each aperture, and an orifice providing compressed air to such air gaps.

5. The machine as recited in claim 2, wherein the trim module compression springs are provided with connecting means to the upper block comprising:
   a. a pair of socket bolts above the compression springs threaded into the upper block;
   b. a pair of spring caps below the compression springs;
   c. a pair of module bolts below the spring caps; and
   d. a pair of module support blocks engaging the module blots from above and connecting to the middle guides.

6. The machine as recited in claim 1, wherein the air operating means further comprises
   a. an air cylinder attached to the machine base;
   b. an air piston contained within the air cylinder;
   c. a carrier spring acting in opposition to the air piston; and
   d. a chip carrier removably affixed to the piston wherein the spring moves the piston and chip carrier to a down position and the air piston moves the chip carrier to an up-actuated position.

7. The machine as stated in claim 1, wherein the modules are exchanged in order to trim, punch and form IC chips selected from the group consisting of DIP, ZIP, PLCC and SOJ packages.

8. The machine as recited in claim 2, wherein the trim module plurality of punches are individually replaceable.

9. A self-cleaning trim form machine comprising:
   a. an upper block and module holder securely affixed to actuating means;
   b. A trim module removably affixed to the module holder and containing a plurality of punches;
   c. a form module removably affixed to the module holder and containing a plurality of punches;
   d. a singulation punch removably affixed to the module holder;
   e. a machine base supporting the actuating means and holding a plurality of removable dies to engage the trim and form modules and punches when said upper block is in a down-actuated position; and
   f. a chip carrier having air operating means affixed to said machine base.

10. The machine as recited in clam 9, wherein the actuating means comprises hydraulic actuating means.

11. The machine as recited in claim 9, wherein the trim module comprises:

a. a trim upper guide provided with at least one aperture;
b. a pair of lower plates secured to the upper guide;
c. a pair of middle plates secured to the lower plates;
d. a pair of upper plates;
e. a plurality of punch tool heads affixed between the middle plates and the upper plates;
f. at least one fastener securely affixing the upper plates, punch, tool heads, middle plates and lower plates to the trim upper guide;
g. said trim upper guide, lower plates and middle plates are provided with upper guide apertures retaining said punches; and
h. a middle guide and lower guide engaging a pair of compression springs affixed to the upper block, and a plurality of middle and lower guide apertures slidably engaging a lower end of said punches.

12. The machine as recited in claim 9, wherein the form module comprises:
   a. a form housing;
   b. a first and second form punch; and
   c. a pair of shoulder fasteners threaded into the pair of form punches, wherein the shoulder fasteners are held captive within the form housing and compressed downward by a pair of springs.

13. The machine as recited in claim 9, wherein the trim form apertures slidably engaging a lower end of said punches are provided with a rectangular cross-sectional dimension and are provided with a semi-round air gap aligned in a vertical direction at four corners of each aperture, and an orifice providing compressed air to such air gaps.

14. The machine as recited in claim 11, wherein the trim form compression springs are provided with connecting means to the upper block comprising:
   a pair of socket bolts threaded into the upper block;
   b. a pair of spring caps below the compressing springs;
   c. a pair of module bolts below the spring caps; and
   d. a pair of module support blocks engaging the module bolts from above and connecting to the middle guide.

15. The machine as recited in claim 9, and wherein the air operating means further comprises:
   a. an air cylinder attached to the machine base;
   b. an air piston contained within the air cylinder;
   c. a carrier spring acting in opposition to the air piston; and
   d. a chip carrier removably affixed to the piston wherein the spring moves the piston and chip carrier to a down position and the air piston moves the chip carrier to an up-actuated position.

16. The machine as stated in claim 9, wherein the modules are exchanged in order to trim, punch and form IC chips selected from the group consisting of DIP, ZIP, PLCC and SOJ packages.

17. The machine as recited in claim 9, wherein the trim module plurality of punches are individually replaceable.

* * * * *